United States Patent [19]

Nadkarni et al.

[11] Patent Number: 5,080,879
[45] Date of Patent: Jan. 14, 1992

[54] PROCESS FOR PRODUCING SILICON CARBIDE PLATELETS AND THE PLATELETS SO PRODUCED

[75] Inventors: Sadashiv K. Nadkarni; Mukesh K. Jain, both of Jonguière, Canada

[73] Assignee: Alcan International Limited, Montreal, Canada

[21] Appl. No.: 440,788

[22] Filed: Nov. 24, 1989

[30] Foreign Application Priority Data

Dec. 1, 1988 [CA] Canada ................................. 584657

[51] Int. Cl.$^5$ ............................................ C01B 33/025
[52] U.S. Cl. ............................ 423/345; 156/DIG. 64; 423/344; 501/88
[58] Field of Search ................... 423/345, 346; 501/88; 156/DIG. 64

[56] References Cited

U.S. PATENT DOCUMENTS

| | | | |
|---|---|---|---|
| 1,344,153 | 6/1920 | Shield | 423/412 |
| 2,797,201 | 6/1957 | Vertch et al. | 521/57 |
| 2,799,912 | 7/1957 | Greger | 423/440 |
| 2,860,509 | 9/1957 | Bozzacco et al. | 521/54 |
| 3,271,109 | 9/1966 | Mezey et al. | 423/345 |

(List continued on next page.)

FOREIGN PATENT DOCUMENTS

| | | | |
|---|---|---|---|
| 1076099 | 5/1957 | Fed. Rep. of Germany | 423/412 |
| 1188046 | 9/1958 | Fed. Rep. of Germany | 423/412 |
| 2518950 | 12/1975 | Fed. Rep. of Germany | |
| 2272032 | 1/1976 | France | |
| 0224886 | 7/1985 | German Democratic Rep. | 561/88 |
| 55-15946 | of 0000 | Japan | |
| 50-160200 | 12/1975 | Japan | |
| 55-159946 | 2/1980 | Japan | 423/406 |
| 54-92629 | 2/1981 | Japan | |
| 0071868 | 5/1982 | Japan | 423/345 |
| 57-071869 | 5/1982 | Japan | |
| 0009807 | 1/1983 | Japan | 423/345 |
| 58-204812 | 11/1983 | Japan | |
| 60-176910 | 3/1985 | Japan | 423/412 |
| 60-081064 | 5/1985 | Japan | |
| 61-155210 | 7/1986 | Japan | 423/412 |
| 7505601 | 11/1975 | Netherlands | |
| 7501762 | 12/1975 | Norway | |
| 2127390A | of 0000 | United Kingdom | |
| 2162504 | 2/1986 | United Kingdom | |

OTHER PUBLICATIONS

Abstract J58045197, High Quality Silicon Carbide Whiskers Mfr.
Silicon Carbide Fiber and Its Production, Abstract 83223698.
Abstract 83-045197, Mfr. of High Quality Silicon Carbide Whiskers.
Hoch et al., "Preparation and Characterization of Ultrafine Powders of Refractory Nitrides: 1, AlN, and $Si_3N_4$", Am. Ceram. Soc. Bull. (U.S.A.), vol. 58, No. 2 (1979), pp. 187–190.

(List continued on next page.)

Primary Examiner—Robert Kunemund
Assistant Examiner—Ken Horton
Attorney, Agent, or Firm—Cooper & Dunham

[57] ABSTRACT

A process for producing silicon carbide platelets and the platelets so produced. The process comprises reacting particles of a non-graphitizable form of hard carbon containing 0.5–1.5% by weight of aluminum and at least 0.2% by weight of iron (preferably anthracite coal, most preferably Pennsylvania anthracite), with silica or a silica precursor at a temperature in the range of 1900°–2100° C. under an inert atmosphere. If the carbon contains 0.2–1.0% by weight of iron, 0.1–10% by weight of boron, relative to the weight of $SiO_2$, is added (if not already present). The carbon is in the form of particles of less than 50μ and the silica or precursor is preferably in the form of particles of less than about 1 μ. The weight ratio of silica to carbon is greater than 1.67:1. The resulting platelets are substantially unagglomerated and preferably of a size of less than 50μ with an aspect ratio greater than 5. The platelets can be used as reinforcements for ceramic and metal matrix materials.

15 Claims, 4 Drawing Sheets

U.S. PATENT DOCUMENTS

| | | | |
|---|---|---|---|
| 3,432,594 | 1/1976 | Gortsema | 501/87 |
| 3,436,179 | 4/1967 | Matsuo et al. | 423/412 |
| 3,615,972 | 10/1971 | Morehouse, Jr. | 521/59 |
| 3,840,647 | 8/1974 | Tomita et al. | 423/345 |
| 3,873,475 | 3/1975 | Pechocek et al. | 521/55 |
| 3,914,360 | 10/1975 | Gunderman et al. | 521/56 |
| 4,104,345 | 8/1978 | Anderson et al. | 264/63 X |
| 4,126,652 | 11/1978 | Oohara et al. | 423/345 |
| 4,190,439 | 2/1980 | Gortsema | 423/437 |
| 4,247,500 | 1/1981 | Dixon et al. | 264/63 |
| 4,256,676 | 3/1981 | Kevach | 264/29.4 X |
| 4,283,360 | 8/1981 | Hermi et al. | 264/63 |
| 4,284,612 | 8/1981 | Horne et al. | 423/345 |
| 4,327,192 | 4/1982 | Henderson et al. | 521/53 |
| 4,504,453 | 3/1985 | Tanaka et al. | 423/345 |
| 4,591,197 | 5/1986 | Tanaka et al. | 423/345 |
| 4,606,902 | 8/1986 | Ritter | 423/345 |
| 4,615,863 | 10/1986 | Inoue et al. | 501/96 X |
| 4,618,582 | 10/1986 | Kiromoto et al. | 423/412 |
| 4,652,436 | 3/1987 | Kato | 423/412 |
| 4,659,022 | 4/1987 | Seider et al. | 423/345 |
| 4,670,407 | 6/1987 | Kiehl et al. | 501/98 X |
| 4,680,153 | 7/1987 | Kinder et al. | 264/29.6 X |
| 4,686,244 | 8/1987 | Dietlein et al. | 521/179 |
| 4,702,900 | 10/1987 | Kurachi | 423/345 |
| 4,752,456 | 6/1988 | Yoda et al. | 423/346 |
| 4,756,895 | 7/1988 | Boecker et al. | 423/345 |
| 4,780,299 | 10/1988 | Kumagai et al. | 423/412 |
| 4,784,839 | 11/1988 | Bachelard et al. | 423/412 X |
| 4,784,939 | 11/1988 | Bachelard et al. | 423/412 X |
| 4,845,059 | 7/1989 | Kohtoka et al. | 501/98 |
| 4,851,205 | 7/1989 | Mitomo | 501/98 X |
| 4,857,246 | 8/1989 | Bolt | 269/29.2 |
| 4,900,531 | 2/1990 | Levin | 423/345 |
| 4,906,324 | 3/1990 | Weaver et al. | 423/345 |

OTHER PUBLICATIONS

Iwama et al., "Ultrafine Powders of TiN and AlN Produced by a Reactive Gas Evaporation Technique with Electron Beam Heating", Journal of Crystal Growth 56 (1982), 265–269, North-Holland Publishing Company.

New Mater. Japan Article-1985.2.(11).2.

Chemical Abstract 95:27225a, "Silicon Nitride Powder", Toray Industries, Inc., Jpn.: Kokai Tokyo Koho, Feb. 20 1981.

PROCESS FOR PRODUCING SILICON CARBIDE PLATELETS AND THE PLATELETS SO PRODUCED

BACKGROUND OF THE INVENTION

I. Field of the Invention

This invention relates to a process for preparing silicon carbide platelets, to the platelets thus formed and to the use of the platelets for particular applications.

Silicon carbide "platelets" are single crystals of SiC having two dimensions appreciably greater than the third. Generally, platelets have an aspect ratio (i.e. length or width to thickness) greater than 3 and preferably greater than 5.

II. Description of the Prior Art

Silicon carbide in the form of whiskers, i.e. single crystals grown primarily in one dimension, can be used as reinforcing materials for matrices made of various materials, particularly ceramics and metals. However, silicon carbide whiskers are suspected of being health hazards because, like asbestos fibres, they easily become airborne and can be ingested by humans or animals. There is therefore a need for an alternative to silicon carbide whiskers that offers similar reinforcing effects without the associated risks.

Silicon carbide platelets have come under consideration as alternatives to whiskers for matrix reinforcement, but the platelets produced by the conventional method of reacting silica and carbon at high temperature are generally highly agglomerated and cannot easily be separated. Agglomerated platelets are not very useful as reinforcing materials because they remain in clumps in the matrix and are difficult to disperse. Moreover, the resulting platelets tend to be thicker than desired for an optimum reinforcing effect.

For silicon carbide platelets to be useful in applications such as reinforcement of ceramic or metal matrix composites, we have found that they must posses specific attributes, namely:

(a) they must be substantially completely unagglomerated;
(b) the size should preferably be in the range of 5–50μ, and preferably 10–20μ;
(c) the aspect ratio (width/thickness) should desirably be greater than 5, at a diameter of 10–20 microns.

For the platelets to possess these attributes, the assynthesized product must be substantially non-agglomerated and the size of the platelets should not exceed 50 microns and preferably 30 microns. Even though it is possible to reduce the size of larger platelets by attrition to the required dimensions, this is undesirable because it results in an undesirable reduction in the aspect ratio.

U.S. Pat. No. 4,756,895 to Boecker et. al., which issued on July 12, 1988, discloses a process for producing crystalline silicon carbide platelets. The process involves heating a porous silicon carbide precursor composition comprising silicon and carbon in intimate contact to a temperature of from 2100° C. to 2500° C. in a non-reactive atmosphere in the presence of a hexagonal crystal growth control additive. The silicon carbide precursor may be a blend of carbon with silica, the silica being in the form of particles, e.g. fume silica having a particle size of 0.005 to 100 microns, or a sol. The carbon may be carbon black or lamp black, i.e. colloidal size carbon having a particle size of about 0.005 to 2 microns. The hexagonal crystal growth control additive is a Group IIIA metal such as boron or aluminum, or mixtures thereof. Although the process of U.S. Pat. No. 4,756,895 appears to be a useful way of producing silicon carbide platelets, we have found that it does not yield unagglomerated silicon carbide platelets of the optimum size and aspect ratio greater than 5 required for good reinforcement effects and therefore believe that there is a need for an improved process of this type.

OBJECTS OF THE INVENTION

Accordingly, an object of the present invention is to provide a process for producing substantially unagglomerated silicon carbide platelets suitable for reinforcing matrix materials, as well as for other purposes, in good yield.

SUMMARY OF THE INVENTION

According to the present invention, there is provided a process for producing silicon carbide platelets, which comprises: reacting particles of a non-graphitizable form of hard carbon containing 0.5–1.5% by weight of aluminum and at least 0.2% by weight of iron, said particles having a size of less than 50μ, with silica or a silica precursor at a temperature between 1900 and 2100° C. under an inert atmosphere in the presence, if the Fe content of the carbon is between 0.2 to 1.0% by weight, of 0.1–10% by weight of $B_2O_3$ based on the weight of the silica, the ratio of the weight of silica to carbon, exclusive of impurities, being greater than 1.67.

In other aspects, the invention relates to silicon carbide platelets, a method of purifying the platelets and matrix materials reinforced by the platelets.

The amounts of the impurities mentioned in the present invention are calculated as the elements themselves but they may be present in the form of compounds such as oxides and carbides.

DETAILED DESCRIPTION OF THE INVENTION

Figure 1:
FIGS. 1–3 are photomicrographs at various high magnifications of SiC platelet products produced according to the Examples.

By controlling the choice of starting materials and the reaction conditions in the manner defined above, the process of the present invention can produce silicon carbide platelets fulfilling the above-defined requirements for good reinforcing effects. The resulting platelets are substantially unagglomerated in the as-produced state and can be easily separated into single particles by mild attrition.

The process of the present invention differs from that of U.S. Pat. No. 4,756,895 in various important respects. In particular, the patent suggests the use of starting materials that are of high purity (column 6, lines 63–64), whereas, in the present invention, we deliberately choose an impure carbon source which contains iron and aluminum. The iron and aluminum in the carbon source affect the formation of the platelets and these elements are dispersed thoroughly within the carbon precursor material, being natural ingredients of that material, which means that desirable platelets are formed in reliable manner and in good yield. Moreover, the process of the present invention is carried out at a lower temperature than that of the U.S. patent and this is also found to give a more desirable product. The lower reaction temperature is feasible due to the presence of the specific impurities (Fe and Al) in the carbon source. This lower reaction temperature is essential to obtain the smaller platelets.

The specific carbon source used in the present invention is a non-graphitizable hard carbon which contains at least 0.2% by weight of Fe and between 0.5 and 1.5% Al and which has been electrically calcined in a non-reactive atmosphere. Anthracite coal is a particularly preferred naturally occurring nongraphitizable hard carbon which contains the required impurities. Anthracite generally contains less than about 10% by weight of volatile materials (normally 7-10%) and less than about 10% by weight of ash remaining after combustion (normally 4-10%). Anthracite is available from various mines around the world, but Pennsylvania anthracite is particularly preferred in the present invention because of its superior results. This anthracite is extremely dense (real density over 1.80) with porosity of less than 10%. A typical electrically calcined (1800-2200° C.) Pennsylvania anthracite composition in percent by weight is shown in Table 1 below:

TABLE 1

| | |
|---|---|
| % Si | 1.3-2.0 |
| % Al | 1.1-1.3 |
| % Fe | 0.3-0.6 |
| % S | 0.3 |
| % Ca | 0.05-0.20 |
| % Ash | 6-10 |
| % Carbon | Balance |

The anthracite, or other similar hard carbon, must be calcined before use at a temperature above about 1500° C. (preferably 1600-2200° C. and optionally about 1800° C.). The only practical way of doing this is by electrical calcination during which an electrical current is passed directly through the coal. The calcination is carried out under a non-oxidizing atmosphere (e.g. an atmosphere of Ar, a vacuum, or the atmosphere generated by the reactants themselves) for a time suitable for the removal of substantially all of the volatiles (usually a few hours). The calcined product should be allowed to cool in the same non-oxidizing atmosphere. The calcined product usually contains 90-96% by weight of carbon, with the remainder being ash. The calcination step also converts the impurities from oxides to carbides. This pre-calcination step is an important feature of the present invention, although the reason why it is necessary is not completely clear.

It is to be noted that the impurities are extremely well distributed in calcined anthracite and play a critical role in the synthesis of the platelets. It is found that similar results cannot be duplicated if similar impurities are added to other carbon sources, such as petroleum coke, carbon black, etc. This indicates that there are some other factors pertaining to the carbon source of the present invention which are critical to the process, although these factores are not clear at this time.

The level of impurities, especially that of Fe, is very critical. At Fe contents between 0.2-1.0% by weight, the addition of boron, preferably in the form of $B_2O_3$, to the extent of 0.1-10% by weight of the $SiO_2$, is found to be essential and should be added if not already present. At Fe contents above about 1%, the addition of boron or other additives is not required to produce suitable platelets. When boron is required, boron oxide or a precursor thereof can simply be added to the mixture of the starting materials or to the anthracite in the "green" state before it is calcined.

The particle size of the carbon source, e.g. anthracite after calcination, is also important. Platelets are not generally produced when the particles have a size above about 50 $\mu$. Particles of calcined anthracite in the size range of 5-50 $\mu$ are preferred and can be obtained by grinding the anthracite after the calcination step, e.g. to −200 Tyler mesh, and preferably to −325 Tyler mesh (equivalent to 45 $\mu$), using suitable equipment, e.g. a ball-mill.

Although it is essential to use the carbon source described above in the present invention, it has been found that this carbon source need not contribute the entire carbon required for the reaction. Up to 50% by weight of the carbon required for the reaction may come from another carbon source such as petroleum coke. However, carbon black and polymeric forms of carbon are unsatisfactory. The use of between 50 and 100% by weight of calcined anthracite and the remainder petroleum coke results in the need for a higher reaction temperature (above 2050° C.) and yields product platelets having a lower aspect ratio of between 3 and 4. A useful product is nevertheless produced.

A second important feature of the invention requires the presence of excess oxygen in the reactants during the reaction step. This is ensured by using excess $SiO_2$ over that required stoichiometrically to produce SiC by the reaction with carbon. This requires a weight ratio of $SiO_2$ to C exceeding 1.67. These ratios refer to pure $SiO_2$ and C, exclusive of any impurities; i.e. for C, this is not the weight of the anthracite, but rather the weight of the C in the anthracite. During the reaction, the excess $SiO_2$ is converted into SiO which then reacts with the impurities to form a liquid phase at temperatures near 2000° C., which helps to promote synthesis of the platelets. Without the excess $SiO_2$, no platelets are produced. The presence of oxygen is so critical that if the reaction is conducted under an atmosphere of pure nitrogen, no platelets are produced. It is found that the $N_2$ replaces the oxygen in the product and thus prevents the formation of the liquid phase. The reaction therefore has to be conducted under an inert atmosphere, such as that formed by a noble gas, e.g. argon. However, nitrogen concentrations up to about 25% by volume can be tolerated without undesirable effects.

Although the silica should be present in stoichiometrical excess, which is the case when the weight ratio is greater than 1.67 as stated, the excess of silica should preferably not be greater than 10% by weight because the excess SiO then tends to block the furnace. The maximum weight ratio of silica to carbon in the starting materials is generally 1.9.

Any suitable source of silica can be employed but amorphous silica, e.g. fume silica obtained from the ferro-silicon industries, is preferred. Alternatively, a silica precursor, i.e. a material that is converted to silica under the reaction conditions, can be employed. Examples of silica precursors are organosilicon compounds such as triethoxysilane. The particle size of the silica or silica precursor is preferably less than 1$\mu$.

Suitable fume silica products can be obtained from SKW (Beacancour, Canada) and Elkem Industries (Norway). Fume silica contains impurities which may help to catalyse the platelet formation, although the impurities (except perhaps for potassium compounds) tend to be the same as those in calcined anthracite. The compositions of two fume silica products useful in the presest invention are shown in Table 2 below, in which percentages are by weight:

TABLE 2

|  | PRODUCT FORM SKW | PRODUCT FORM ELKEM |
|---|---|---|
| % C | 1–2 | 1–2 |
| % Fe$_2$O$_3$ | 0.15–0.40 | 0.05–0.10 |
| % Al$_2$O$_3$ | 0.60–1.00 | <0.1 |
| % CaO | 0.40 | 0.3 |
| % K$_2$O | 0.70–1.00 | 0.5 |
| % SiO$_2$ | balance | balance |

Another important feature of the present invention is the nature of the reaction vessel, i.e. the crucible, used for the platelet-forming reaction. Although it is possible to use crucibles made of materials other than carbon, e.g. silicon carbide and alumina, carbon and particularly graphite crucibles are preferred. However, when carbon or graphite crucibles are employed, they should preferably be "aged" prior to use. The aging is normally carried out by charging the crucible with a reaction mixture containing an excess of silica over that required to make the platelets (a 30% excess is usually found satisfactory to produce the required effect). The crucible, charged with the above mixture, is passed through the furnace under the usual heating conditions. Most or all of the excess silica reacts with the carbon at the surface of the crucible to form a protective coating of SiC. Any silica that does not react with the surface carbon will react with the carbon of the mixture to form reject product which is simply discarded. If the reaction of the invention is carried out in carbon crucibles that have not been aged in this way, and whose surfaces consist of unprotected carbon, the SiO produced during the reaction will react with these surfaces rather than with the carbon in the reaction mixture and thereby the reaction mixture will become deficient in oxygen and platelets will not be formed.

The reaction of the present invention normally takes about one to two hours to complete and, after completion, the inert atmosphere should be maintained until the product has cooled down sufficiently.

Without wishing to be limited to any particular theory, it is believed that the process of the present invention can be explained by the following model. At a temperature of 1515° C., each grain of anthracite is converted into a densely packed polycrystalline grain of β-SiC below 1 μin size. At 1809° C., the excess SiO$_2$ reacts with the SiC to produce SiO which in turn reacts with the impurities to form a boundary layer phase which comprises Fe, Si, Al, O and C. The concentration of the Fe is critical to ensure that this phase becomes liquid at temperatures close to 2000° C. The addition of boron is further helpful to lower the melting point, especially when the Fe content is low. The liquid phase promotes grain growth and helps to transform the submicron β-SiC to α platelets which are greater than 5 μin size. In order that this be feasible, every grain of the carbon must contain the impurities. The two most critical constituents of the liquid phase are Fe and O. If one or the other is not present, then transformation into platelets does not occur. When the anthracite grain is too large in size, the centre remains covered and thus some carbon remains unreacted, which prevents transformation into platelets. The electrically calcined anthracite has very little porosity, which helps the dense packing of the SiC and therefore helps the diffusion process. The growth of the densely packed particulates into larger platelets helps to create voids and thus prevents agglomeration of the product.

If desired, the silicon carbide products of the present invention can be purified by the following procedure so that they can be used more effectively for such purposes as reinforcements for ceramic matrix composites, for which purpose in particular impurities are generally unacceptable because they form glassy phases in the final products.

The impurities in the silicon carbide product produced by the present invention, such as Fe, Al, Ca, B, etc., are normally present to a large extent on the external surfaces of the platelets, often at the boundary between two adjacent particles, and are usually in the form of silicides. Although the impurities, being on the surface, are accessible to acid leaching, they cannot be removed by HCl (which is normally used for such purposes). It is believed that this is because the impurities are protected by a protective layer of SiO$_2$ during the formation process mentioned above. This problem can, however, be overcome by using a combination of HF and HCl or gaseous chlorine, because the HF dissolves the SiO$_2$ and the impurities become accessible to the HCl or Cl$_2$. For example, the purification procedure can be carried out by first leaching the product in hydrofluoric acid at a temperature of about 70° C. to remove the protective coating of SiO$_2$, and then treating the resulting product with either hydrochloric acid or with gaseous chlorine to remove the exposed impurities. When iron is the impurity, the reaction involved is given below:

$$FeSi + 3HCl + 6HF \rightarrow FeCl_3 + H_2SiF_6 + 3.5H_2 \uparrow$$

As noted above, the platelets produced by the present invention, especially those having small diameters between 10 and 30μ and aspect ratios between 5 and 10, can be used in particular for the reinforcement of ceramic matrix composites. Any suitable matrix material may be reinforced in this way, examples being alumina, mullite, silicon nitride, etc. Reinforcement of these materials using the platelets of the present invention can produce products having mechanical properties similar to those obtained with SiC whiskers due to the high aspect ratios and small size (preferably 10–20μ) of the platelets, while avoiding the health risks attendant on the use of whiskers.

The invention is illustrated further by the following non-limiting Examples and Comparative Examples.

EXAMPLE 1

SiO$_2$ fumes from SKW and electrically calcined anthracite coal (<325 mesh in size) were mixed together in the ratio 3:1.25. The mixture was calcined at 2050° C. for 1.5 hours under an argon atmosphere. The product comprised thick platelets of SiC having an aspect ratio generally around 2–5.

This Example demonstrates that platelets can be formed using SiO$_2$ and electrically calcined anthracite coal as a carbon source. The platelets thus produced were adequate but had an aspect ratio somewhat lower than optimum.

EXAMPLE 2

The procedure was identical to the previous Example except that $B_2O_3$ was also added to the mixture. The ratio of $SiO_2$: anthracite:$B_2O_3$ was 3:1.25:0.3. The mixture was calcined at 2050° C. for 1.5 hours under argon. The product comprised thin platelets of SiC having a thickness of 2-5μ, a diameter of 40-80μ and an aspect ratio in the range of 5-15 (FIG. 1).

EXAMPLE 3

Figure 2:
Figure 3:

The ratio of $SiO_2$:anthracite:$B_2O_3$ was 2.5:1.80:0.55 in this Example, thus more $B_2O_3$ was used than in Example 2. The Fe content of the anthracite was 1.4%. The reaction was carried out at 2060° C. for two hours under an atmosphere of argon. The product comprised platelets not exceeding 40 microns in diameter with a thickness between 1-2 microns (see FIGS. 2 and 3 which are photomicrographs of the product at magnifications of 500× and 4000×, respectively). The high Fe content of the anthracite coupled with the fact that an excess of $B_2O_3$ was provided resulted in increasing the aspect ratio to a very high level while restricting the top size to 40 microns.

EXAMPLE 4

The ratio of $SiO_2$:anthracite:$B_2O_3$ was changed to 3:1.45:0.2 in this Example. The calcination was carried out under an argon atmosphere at temperatures of a) 2040° C., b) 2010° C., c) 1990° C., d) 2000° C. for 1.5 hours. Products from all the tests were very similar to that obtained in Example No. 2.

EXAMPLE 5

The ratio of $SiO_2$:anthracite:$B_2O_3$ was 3:1.40:0 3 in this Example. The calcination was carried out at 1940° C. for 1.5 hours under argon. The product comprised very similar platelets to those obtained in Example 4.

COMPARATIVE EXAMPLE 1

Polyacrylonitrile (PAN) was dissolved in a solvent, dimethylformamide (DMF), to form a 10 wt % concentration solution. Under-calcined petroleum coke dust and fume $SiO_2$ from SKW were suspended in the solution using a high shear blender. The solution was passed through an orifice and the solvent was extracted in a bath containing 40% DMF, 60% water. The ratio of $SiO_2$/coke dust/PAN was maintained at 3:1.1:1 corresponding to an $SiO_2$/C ratio of 1.88:1. The precipitated noodles were dried and oxidized at 200° C. for 8 hours in air to cyclise and crosslink the polymer. The stabilized noodles were calcined at 2100° C. under an argon atmosphere for 1.5 hours. The product contained substantially non-agglomerated particles (but not platelets) of SiC less than 5μ in size.

COMPARATIVE EXAMPLE 2

This experiment was identical to the previous one except that weight ratio of $SiO_2$:coke dust:PAN was maintained at 3:1.1:0.6. These noodles were not stabilized. The SiO/C ratio was approximately 2.24:1. The calcination was carried out at 2075° C. under argon for 1.5 hours. The product contained substantially non agglomerated particles (not platelets) of SiC in the size range of 10-30μ.

Comparative Examples 1 and 2 demonstrate that large SiC particulates can be formed using $SiO_2$ containing catalytic impurities such as Fe, K, etc. and reacting it with a source of carbon such as under-calcined petroleum coke dust or carbon derived from a polymer such as PAN in a proportion such that $SiO_2$ is substantially in excess of the stoichiometric quantity required for the reaction. The size can be increased by increasing the quantity of excess $SiO_2$. However, the product thus formed is particulate in shape and not platelet.

COMPARATIVE EXAMPLE 3

The weight ratio of $SiO_2$:anthracite:$B_2O_3$ was 3:1.85:0.3. Calcination was carried out at 2050° C. for 1.5 hours under argon. The product comprised only agglomerated particulates (FIG. 10).

Example 4 and Comparative Example 3 demonstrate that, unless excess $SiO_2$ over the stoichiometric amount is present, no platelets are formed.

COMPARATIVE EXAMPLE 4

$SiO_2$, electrically-calcined anthracite and $B_2O_3$ were mixed in the weight proportion 3:1.3:0.3 and calcined at a temperature of 1900° C. for 1.5 hours under argon. The product was essentially agglomerated particulates. This experiment demonstrates that a critical calcination temperature (1900° C.) has to be exceeded to obtain the product as non-agglomerated platelets.

COMPARATIVE EXAMPLE 5

$SiO_2$, carbon black and $B_2O_3$ were mixed together in the weight proportion 3:1.3:0.3. Calcination was carried out at 2010° C. for 1.5 hours under argon. The product comprised agglomerated particulates.

COMPARATIVE EXAMPLE 6

$SiO_2$, coke dust and $B_2O_3$ were mixed together in the weight ratio 3:1.3:0.3 and calcined at 2010° C. for 1.5 hours under argon. The product comprised agglomerated particulates.

COMPARATIVE EXAMPLE 7

$SiO_2$, graphite powder and $B_2O_3$ were mixed together in the weight ratio 3:1.3:0.3 and calcined at 2010° C. for 1.5 hours under argon. The product comprised agglomerated particulates.

Comparative Examples 5, 6 and 7 demonstrate the effect of the carbon source on the product formed. Electrically calcined anthracite coal, when used along with $B_2O_3$, yielded platelets; whereas the same catalyst did not have any effect while using petroleum coke or graphite or carbon black. This may be due to the impurities such as Si, Al and Fe present in the calcined anthracite and the form in which they are present (i.e. as carbides). The carbide crystals may act as seed crystals from which the SiC platelets precipitate out.

COMPARATIVE EXAMPLE 8

$SiO_2$, coke dust, PAN powder and $Al_2O_3$ were mixed in the weight proportion 3:1.2:0.2:0.2. The mixture was calcined at 2075° C. for 1.5 hours. The product was in the shape of platelets but they were considerably agglomerated.

This Comparative Example and Comparative Example 6 demonstrate that whereas $B_2O_3$ has no influence on platelet formation while using coke dust, $Al_2O_3$ can act as a catalyst in this case. The platelets thus formed were highly agglomerated and therefore not suitable for use as reinforcement.

COMPARATIVE EXAMPLE 9

Green anthracite coal (−325 mesh) from Pennsylvania (from the same source as used in all previous examples, but not calcined), $SiO_2$ and $B_2O_3$ were mixed together in the weight ratio 1.30:3.0:0.3. Calcination was carried out at 1990° C. for 1 hour, 45 minutes. The product comprised particulates.

This Comparative Example shows that the carbon source, i.e. anthracite, must be pre-calcined to transform the impurities into carbides. In the green material, they are present as oxides and as such do not aid in formation of platelets.

COMPARATIVE EXAMPLE 10

$SiO_2$, electrically calcined anthracite (Pennsylvania), $B_2O_3$ and submicron SiC powder were mixed together in the weight proportion 3:1.45:0.2:0.15. The mixture was calcined at 2000° C. for 1 hour, 45 minutes under argon. The product contained agglomerated particulates.

This Comparative Example demonstrates that externally added seed crystals of SiC were in fact detrimental in converting the material to platelets.

EXAMPLE 6

Purification of Platelets

Silicon carbide platelets having the following impurities were purified by the procedure outlined below:

| Impurity | % by weight |
| --- | --- |
| Fe | 1.18% |
| Ca | 0.123% |
| Al | 0.61% |
| Ti | 0.086% |

The platelets (40g) were added to a plastic container along with 48% HF (20ml), 36% HCl (27 ml) and 153 ml of water. The leaching step was carried out at about 70° C. for 6 hours while maintaining the suspension under constant agitation.

The platelets were filtered, washed and dried. They were found to have the following impurities.

| Impurities | % by weight |
| --- | --- |
| Fe | 0.05 |
| Ca | 0.001 |

This represents a considerable purification of the original platelets.

EXAMPLE 7

Platelet Reinforced Composite

Raw Materials

Figure 4:
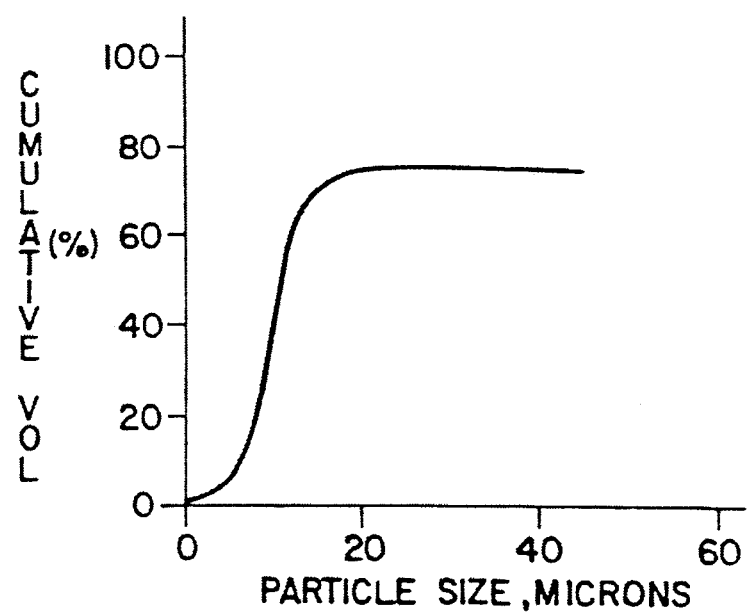
FIG. 4 is a graph showing particle size distribution obtained in Example 7.
Figure 5:
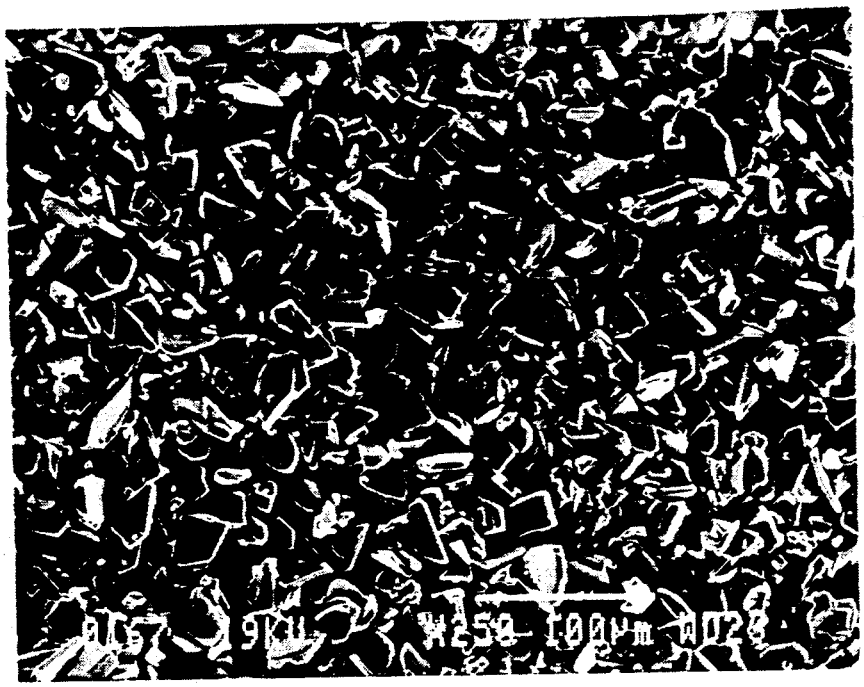
FIGS. 5–8 are photomicrographs of starting materials and products according to Example 7.

The SiC platelets employed for this test were prepared by the procedure of Example 2 and then classified with Nisshin Turbo classifier 15M to produce a narrow size distribution (median 12μ, see FIG. 4). An SEM photograph (FIG. 5) suggests an aspect ratio of 8-10. X-ray diffraction analysis revealed a majority phase of α-SiC. Table 3 gives the results of X-ray fluorescence analysis of the impurities.

TABLE 3

| IMPURITIES PRESENT IN Sicp-XRF ANALYSIS | |
| --- | --- |
| ELEMENT | DETECTED % |
| Fe | 0.05 |
| Ca | 0.03 |
| Al | 0.65 |

Figure 6:
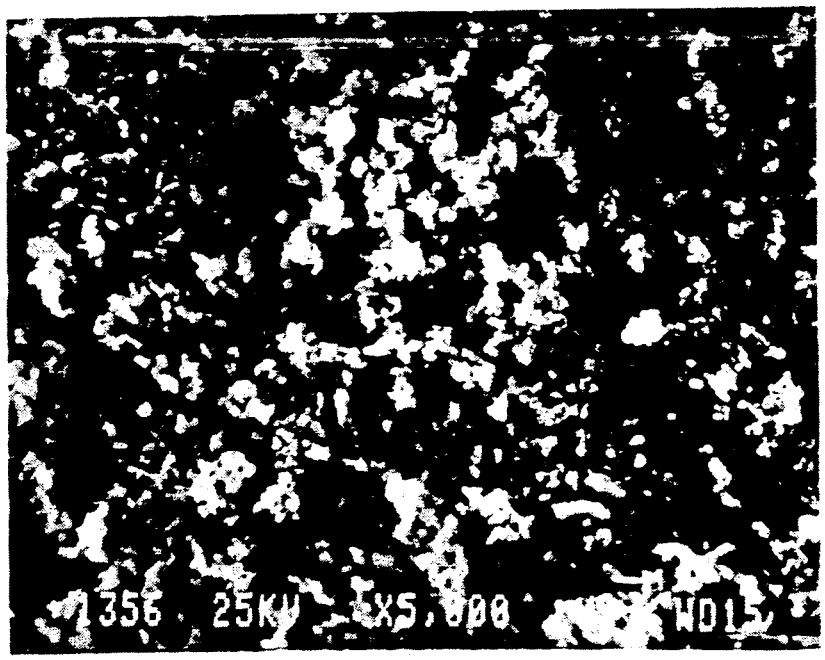

The $Al_2O_3$ employed was very fine, obtained from Alcoa grade A-16SG. The size was submicron as can be seen from FIG. 6. These alumina powders (−325 mesh to 99-100%) have the following impurity content reported: 0.025—$SiO_2$, 0.01—$Fe_2O_3$, 0.08—wt % $Na_2O$.

Mixing of Materials

The alumina powder was mixed with distilled water to achieve a 10% solid loading in the mixture. The resulting slurry was subjected to ultrasonic treatment in order to produce a good dispersion. Ammonium hydroxide solution was added slowly to raise the pH of the solution to about 10 or more.

This step enabled the alumina powder to defloculate. This mixture was then placed on a magnetic stirrer. The SiC platelets (30% by volume of the total solids) were added to the mixture in the desired proportion and the pH of the solution was lowered to 7 by addition of dilute $HNO_3$. The slurry was continuously stirred and heated on a hot plate to gradually evaporate the liquid. The evaporation was carried out until the slurry had a solids content of more than 40%. The resulting thick slurry was completely dried in an oven at 100° C. until a dry cake was obtained. This dry cake was transformed into a free flowing powder by crushing with mortar and pestle, followed by screening with a 65 Tyler mesh sieve.

Figure 7:
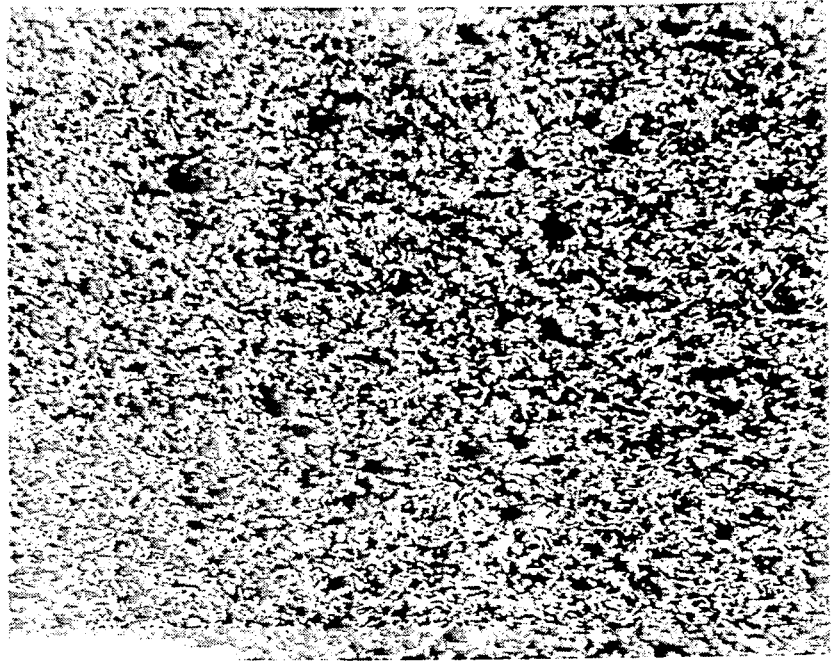
Figure 8:
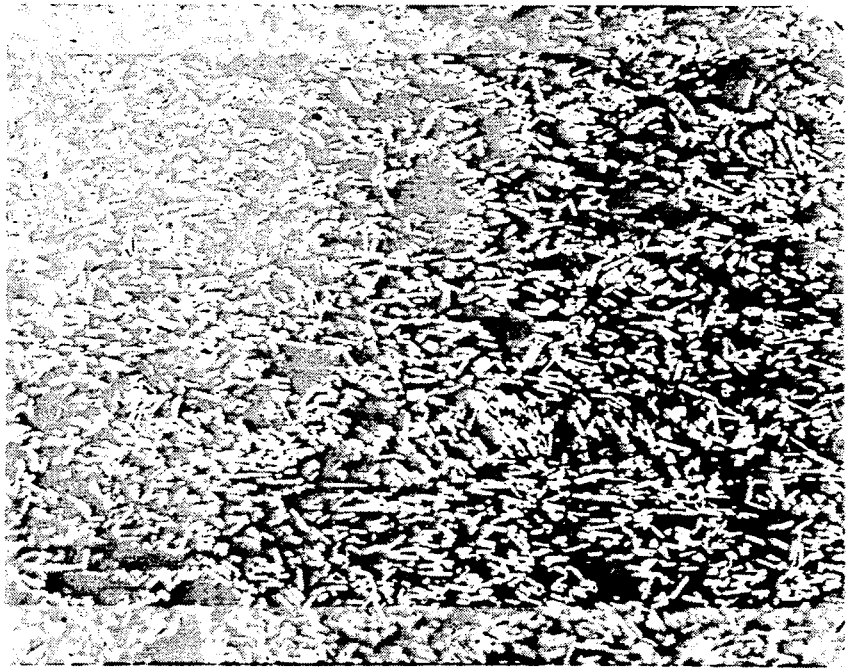

Hot Pressing 35 grams of powder was hot pressed at 6000 psi. The temperature was slowly raised to 1700° C. and held for 30 minutes. The final tile was approximately 40 mm wide × 50 mm long × 5 mm thick. The density of the sample was measured after rough polishing to be about 98% of the theoretical density. Fine polishing was performed for microstructural examination. The optical microscopy suggested fairly uniform distribution of platelets in the matrix (FIG. 7). A closer examination of the surface (at 200×) showed orientation of platelets perpendicular to the hot processing axis direction (FIG. 8). The surface was virtually free of porosity.

EXAMPLE 8

Platelet Reinforced Composite

A second experiment with the same mixture as in Example 7 was made at a higher ram pressure. The following sequence was followed:
10 min. at 800° C. with 3000 psi
30 min. at 1700° C. with 6000 psi
10 min. at 800° C. with 3000 psi
to obtain a higher product density (99%). The heating rates were set at 25.C/min.

COMPARATIVE EXAMPLE 11

In this case, an attempt was made to duplicate the process disclosed in the Boecker et. al. patent referred to above. Using the procedural steps set out in the patent, when petroleum coke was used as the carbon source, no platelets were produced at a temperature of 2100.C When the temperature was increased to 2150° C., large platelets of about 150–300 microns in diameter were produced. These platelets could be broken down to 20 microns, but then they did not have the desired aspect ratios. It was also found that the large platelets were full of defects which is very undesirable for a reinforcement material.

At the higher operating temperature, namely 2150° C., a considerable amount of SiC volatilized and subsequently deposited on cooler parts of the furnace. These deposits blocked the passages of the crucibles and had to be removed by closing down the furnace, cooling it and mechanically removing the deposit.

What we claim is:

1. A process for producing silicon carbide platelets, which comprises:

reacting a powder of Pennsylvania anthracite coal, as a non-graphitizable form of hard carbon, containing 0.5–1.5% by weight of aluminum and at least 0.2% by weight of iron, particles forming said powder having a size of less than 50μ, with silica or a silica precursor at a temperature between 1900 and 2100° C. under an inert atmosphere in the presence, if the Fe content of the anthracite is between 0.2 to 1.0% by weight, of 0.1–10% by weight of $B_2O_3$ based on the weight of the silica, the ratio of the weight of silica to carbon, exclusive of impurities, being greater than 1.67.

2. A process for producing silicon carbide platelets, which comprises:

reacting a powder of a non-graphitizable form of hard carbon, containing 0.5–1.5% by weight of aluminum and at least 0.2% by weight of iron, particles forming said powder having a size of less than 50μ, with fume silica from the ferrosilicon industry at a temperature between 1900 and 2100° C. under an inert atmosphere in the presence, if the Fe content of the carbon is between 0.2 to 1.0% by weight, of 0.1–10% by weight of $B_2O_3$ based on the weight of the silica, the ratio of the weight of silica to carbon, exclusive of impurities, being greater than 1.67.

3. A process according to claim 1 or 2 wherein said silica or precursor is in the form of a powder made up of particles having a size of less than about 1 μ.

4. A process according to claim 2 wherein said non-graphitizable form of hard carbon is electrically calcined anthracite coal.

5. A process according to claim 2, wherein the particles of said hard carbon have a size of 5–50μ.

6. A process according to claim 1 or 2, wherein said inert atmosphere comprises a noble gas.

7. A process according to claim 1 or 2, wherein said inert atmosphere comprises argon.

8. A process according to claim 1 or 2, wherein said inert atmosphere contains up to about 25% by volume of nitrogen.

9. A process according to claim 1 or 2, wherein the ratio of silica to carbon is 1.67–2.3 by weight.

10. A process according to claim 4, wherein the anthracite coal is Pennsylvania anthracite.

11. A process according to claim 1 or 2, wherein said process is carried out in a graphite crucible previously exposed to silicon monoxide.

12. A process according to claim 1 or 2, wherein said silicon carbide platelets are purified, after formation, by treating them with hydrofluoric acid and a reagent selected from the group consisting of HCl and gaseous chlorine.

13. A process according to claim 1 or 2, wherein said platelets are of an average diameter of 10 to 30μ and have aspect ratios of 5 to 8.

14. A process according to claim 1 or 2, wherein said non-graphitizable hard carbon forms at least 50% by weight of the carbon with which said silica or silica precursor reacts to form said platelets.

15. A process according to claim 14 wherein the remainder of said carbon with which said silica or silica precursor reacts is derived from petroleum coke.

* * * * *